(12) United States Patent
Bohnert et al.

(10) Patent No.: US 7,339,680 B2
(45) Date of Patent: Mar. 4, 2008

(54) TEMPERATURE-STABILIZED SENSOR COIL AND CURRENT SENSOR

(75) Inventors: Klaus Bohnert, Oberrohrdorf (CH); Philippe Gabus, Nussbaumen (CH); Hubert Brändle, Oberengstringen (CH)

(73) Assignee: ABB Research Ltd, Zurich (CH)

( * ) Notice: Subject to any disclaimer, the term of this patent is extended or adjusted under 35 U.S.C. 154(b) by 195 days.

(21) Appl. No.: 10/922,944

(22) Filed: Aug. 23, 2004

(65) Prior Publication Data

US 2005/0088662 A1  Apr. 28, 2005

(30) Foreign Application Priority Data

Sep. 3, 2003  (EP) .................. 03405641

(51) Int. Cl.
*G01B 9/02* (2006.01)

(52) U.S. Cl. ...................................... 356/483

(58) Field of Classification Search ................ 356/460, 356/495, 477, 483, 465; 250/227.19, 227.27; 385/12; 324/96
See application file for complete search history.

(56) References Cited

U.S. PATENT DOCUMENTS

| 4,255,018 | A |   | 3/1981 | Ulrich et al. |         |
|-----------|---|---|--------|---------------|---------|
| 5,500,909 | A |   | 3/1996 | Meier         |         |
| 5,953,121 | A | * | 9/1999 | Bohnert et al. | 356/481 |
| 2001/0050551 | A1 | | 12/2001 | Bohnert et al. | |

FOREIGN PATENT DOCUMENTS

| DE | 19802191 A1 | 8/1999 |
| EP | 0856737 | 8/1998 |
| EP | 1115000 A | 7/2001 |
| EP | 1154278 A2 | 11/2001 |
| JP | 57184973 | 11/1982 |
| JP | 2000111586 | 4/2000 |
| WO | WO 03/071290 A1 | 8/2003 |

OTHER PUBLICATIONS

R.A. Bergh et al., "An Overview of Fiber-Optic Gyroscopes", Journal of Lightwave Technology, vol. LT-2, No. 2, Apr. 1984.

(Continued)

*Primary Examiner*—Hwa (Andrew) Lee
(74) *Attorney, Agent, or Firm*—Buchanan Ingersoll & Rooney PC

(57) ABSTRACT

The fiber-optic sensor head (2) for a current or magnetic field sensor comprises an optical fiber which contains a magnetooptically active sensor fiber (3) and at least one polarization-maintaining supply fiber (5), which are optically connected, with the sensor fiber (3) having its fiber protective sheath removed. The sensor head (2) furthermore contains a capillary (6), in which at least the sensor fiber (3) is arranged. Furthermore, the sensor head (2) can be bent in the area of the sensor fiber (3), and a friction reducing means (7) is provided in the capillary (6), in order to reduce the friction between the sensor fiber (3) and the capillary (6). The friction reducing means (7) is advantageously an oil or a dry lubricating means (7). The capillary (6) is advantageously encased by a capillary casing (8). The sensor (2) allows very largely temperature-dependent measurements, is easy to install and allows measurements on large cross-section conductors.

22 Claims, 5 Drawing Sheets

OTHER PUBLICATIONS

K. Bohnert et al., "Temperature and Vibration Insensitive Fiber-Optic Current Sensor", Journal of Lightwave Technology, vol. 20, No. 2, Feb. 2002, pp. 267-276.

J.H. Haywood et al., "Application of the NIMI Technique to the 3×3 Sagnac Fibre Optic Current Sensor—Experimental Results", 15th Optical Fiber Sensors Conference, Portland, OR, May 6-Oct. 2002, Technical Digest pp. 553-556.

K.B. Rochford, et al., "Polarization Dependence of Response Functions in 3×3 Sagnac Optical Fiber Current Sensors", Journal of Lightwave Technology, vol. 12, No. 8, Aug. 1994, pp. 1504-1509.

A. Papp et al., "Magnetooptical current transformer. 1: Principles", Applied Optics, vol. 19, No. 22, Nov. 15, 1980, pp. 3729-3734.

A.J. Rogers et al., "Vibration Immunity for Optical-Fibre Current Measurement", 10th Optical Fiber Sensors Conference, GlasgowOct. 11-13, 1994, Proceedings SPIE 2360, pp. 40-44.

European Search Report issued in corresponding European Patent Application No. 03405641.6 dated Feb. 5, 2004.

* cited by examiner

TEMPERATURE-STABILIZED SENSOR COIL AND CURRENT SENSOR

TECHNICAL FIELD

The invention relates to the field of fiber-optic sensor systems. It relates in particular to a sensor head and to a current or magnetic field sensor as claimed in the precharacterizing clause of the independent patent claims.

PRIOR ART

A sensor head such as this is known, for example, from EP 0,856,737 A1, which describes a fiber-optic current sensor with a sensor head which contains a sensor fiber that is arranged in a capillary. The sensor fiber has its fiber protective sheath removed from it, and is then heat-treated in order to remove mechanical stresses which lead to disturbing influences resulting from accidental birefringence. This results in the temperature stability of the sensor measurements being improved. A protective gas or else an oil is introduced into the capillary in order to prevent moisture or chemically aggressive vapors from penetrating into the capillary interior, which could cause chemical damage to the sensor fiber from which the fiber protective sheath has been removed.

A sensor head such as this has the disadvantage that it is difficult to install and is scarcely suitable for temperature-stable measurement of current in large-diameter electrical conductors.

The following possible ways to suppress disturbing birefringence in optical fibers are also known from the prior art: the use of "hibi spun" fibers. In the case of "hibi spin" fibers, disturbing linear birefringence is suppressed by frozen-in circular birefringence. This has the disadvantage that the measurement signal varies relatively sharply with temperature (typically several percent per 100° C.). It is also possible to use fibers composed of flint glass. The elasto-optical coefficients of flint glass are very low, so that external forces cause only minor linear birefringence. However, flint glass fibers have less chemical and mechanical resistance than quartz glass fibers, and a fused joint (fiber splice, fusion splice) with a supply fiber or with a phase delay element composed of quartz glass is impossible. Furthermore, the use of mechanically twisted fibers is known. However, corresponding coils are difficult to manufacture, and their long-term reliability is questionable.

DESCRIPTION OF THE INVENTION

The object of the invention is therefore to provide a sensor head and a current or magnetic field sensor of the type mentioned initially which do not have the disadvantages mentioned above. One particular aim is to provide largely temperature-independent current or magnetic field measurement with a sensor head which can be installed easily, and which allows measurements with large sensor coil diameters, such as those which are required for the measurement of current in large cross-section electrical conductors.

This object is achieved by a sensor head and a sensor having the features of the independent patent claims.

A fiber-optic sensor head according to the invention for a current or magnetic field sensor comprises:

an optical fiber which contains a magnetooptically active sensor fiber and at least one supply fiber which are optically connected, with the sensor fiber having its fiber protective sheath removed, and a capillary in which at least the sensor fiber is arranged.

The sensor head is characterized in that the sensor head can be bent in the area of the sensor fiber, and in that a friction reducing means is provided in the capillary, in order to reduce the friction forces between the sensor fiber and the capillary.

It is thus possible to install the sensor head easily and nevertheless to largely eliminate temperature-dependent and bending-dependent disturbance influences on measurements carried out by means of the sensor head. In the case of the sensor heads which are known from the cited EP 0,856,737 A1, the sensor fiber is tempered for a certain time at its softening temperature. A heat treatment such as this gives the sensor fiber a fixed form. Its mechanical breaking stress is reduced. If one tries to deform a sensor fiber such as this, it will break, or at least new, large, undesirable birefringence will be induced in the fiber, so that the aim of the heat treatment, specifically to remove birefringence from the sensor fiber, will be nullified again.

Birefringence in the sensor fiber is undesirable, particularly when it is still dependent on the temperature, since the birefringence results in, for example, a circular polarization state for the light propagating in the sensor fiber being disturbed rather than being maintained. In order to maintain a measurement error of less than about 0.2%, any phase shift caused by birefringence should as far as possible have an amplitude of not more than about 10°, and should at most vary by a small number of degrees, over the entire relevant temperature range. The birefringence is caused by the influence of external forces on the sensor fiber.

However, particularly in the case of large-diameter coils, in which the sensor fibers have correspondingly large radii of curvature, it has been found that the influence of the birefringence which is induced by the curvature of the sensor fiber itself is less than the influence of that undesirable birefringence which is induced during the bending of the sensor head to form a coil, as a result of friction forces between the capillary and the fiber which is arranged in the capillary. The first-mentioned bending-induced birefringence is about 1.1° per turn of the coil, for example, for a coil diameter of 1 m, with a fiber diameter of 80 micrometers and a light wavelength of 800 nanometers. The last-mentioned birefringence is on the one hand dependent on the temperature in a non-reproducible manner, so that a measurement signal obtained by means of the sensor head is temperature-dependent in an undesirable manner. On the other hand, the friction forces and the birefringence caused by the latter change when the coil is opened and closed, for example for transport and installation, or its shape is changed in some other way. This results in an undesirable change in the measurement sensitivity and/or in the calibration of the sensor. In addition, in the event of temperature changes, the mutual arrangement of the fiber and capillary can also change, as a result of which further undesirable changes occur in the birefringence of the sensor fiber owing to the interaction forces between the fiber and the capillary when temperature changes occur. This friction-dependent, undesirable birefringence can be largely avoided by the friction reducing means.

Since the sensor head is bendable and nevertheless has only a small amount of birefringence, it can easily be installed. If, for example, the aim is to measure a current flowing through an electrical conductor, the electrical conductor need not be interrupted in order to place the sensor fiber around the electrical conductor. Furthermore, there is no need to predetermine the geometry of a coil to be formed from the sensor head. The coil shape may, for example, be round, elliptical, oval or in the form of a racetrack, depending on the application (electrical conductor cross-section geometry). Furthermore, one, two or more coil turns may be produced, so that the sensor head can be flexibly matched to a measurement problem.

The magnetooptical activity of the sensor fiber means that it has a Verdet constant which does not disappear.

The supply fiber is used to guide the light and the optical connection of the sensor head to an optoelectronic module, which is used to produce and detect light and to evaluate measurement signals.

The fact that the sensor fiber has had its fiber protective sheath removed avoids undesirable birefringence being induced by mechanical forces which the fiber protective sheath exerts on the fiber, as occur in general in the event of temperature changes since, in general, the thermal coefficients of expansion of the fiber protective sheath and cladding are different. Such disturbing birefringence typically leads to measurement inaccuracies of 1% to 2%, or more.

The capillary provides the mechanical protection for the fiber from which the fiber protective sheath has been removed.

In one preferred embodiment of the subject matter according to the invention, the sensor fiber is not heat-treated at at least the softening temperature of the sensor fiber material. In consequence, the sensor fiber remains in a particularly flexible state, thus considerably simplifying the manufacture of sensor heads for large-diameter coils, and the installation of the sensor head.

In a further advantageous embodiment, in the installed state, the sensor fiber has a radius of curvature of at least 0.25 m, and in particular at least 0.4 m or at least 0.5 m. With large radii of curvature such as these, and corresponding coil diameters, the birefringence induced by the bending of the sensor fiber is relatively small. Furthermore, in the case of large coil diameters such as these, current can be measured in conductors with a very large cross section such as those which occur in the manufacture of aluminum.

In one particularly advantageous embodiment, a portion of the at least one supply fiber is arranged within the capillary. This embodiment has the advantage that a portion of the supply fiber is also mechanically protected by the capillary. Furthermore, in this embodiment, a holder which may possibly be provided at at least one capillary end, or a closure means provided there, can be mechanically connected to the supply fiber, which is typically mechanically not sensitive with respect to the sensor fiber, so that no disturbing birefringence is induced in the sensor fiber by the holder or the closure means.

Both the capillary and the sensor fiber are advantageously essentially composed of quartz glass. In consequence, they both have the same thermal coefficients of expansion and, furthermore, it is simple to produce fiber splices from quartz glass.

In a further advantageous embodiment, the capillary is encased by a capillary casing. This avoids microscopic cracks which occur on the surface of the capillary when the sensor head is bent frequently. Microscopic cracks such as these can lead to fracture of the capillary.

The capillary is advantageously arranged within a fiber protective hollow cable. The fiber protective hollow cable is used to protect the fiber and the capillary against external mechanical influences.

It is particularly advantageous for the friction reducing means to be a liquid, in particular an oil, or a powder.

In one preferred embodiment, the capillary is closed at its ends by means of a closure means, contains a liquid as the friction reducing means, and contains a gas in order to absorb temperature-dependent volume changes of the friction reducing means. This results in a capillary which is reliably closed over a wide temperature range. The temperature-dependent expansion change in the friction reducing means can be compensated for over a desired temperature range by means of an easily compressible gas, so as to avoid falling below or exceeding a minimum and maximum pressure, which can be predetermined in the capillary. The gas may, for example, be arranged as a single volume (a column) at one end of the capillary or as two volumes (columns), each arranged at one end of the capillary, or else it may be in the form of an even greater number of separate volumes, which are distributed along the axis of the capillary. In particular, a mixture, an emulsion, can also advantageously be formed from the friction reducing means and the gas. It is generally advantageous to close the capillary when the friction reducing means can flow out or be vaporized.

In a further advantageous embodiment, the friction reducing means is in the form of a thin, friction-reducing layer on the fiber and/or on the inner face of the capillary. In this case, less of the friction reducing means is required. Furthermore, in some situations, there may be no need to close the capillary. By way of example, the layers may be oil films or layers composed of a dry lubricant such as $MoS_2$, or a nanotechnology lubricant from a single molecular layer, or from a small number of molecular layers.

The capillary can advantageously be closed at its ends by means of an adhesive as the closure means. This makes it possible to reliably close the capillary in a simple manner in order to protect the sensor fiber and/or in order to prevent the friction reducing means and, if appropriate, a gas that is contained in the capillary, from emerging.

In order to close the capillary, the capillary can advantageously be provided at each of its ends with an extension piece in the form of a flexible tube, with the extension pieces each having a first part which, at one end of the capillary in each case, externally surrounds the capillary or, possibly, the capillary casing, and each have a second part, which projects beyond the respective end of the capillary in the axial direction, with the closure means being introduced into the second part of the extension pieces.

In one preferred embodiment, the optical fiber contains at least one phase delay element, which is optically connected to the sensor fiber and to the at least one polarization-maintaining supply fiber, with the at least one phase delay element being arranged between the sensor fiber and the at least one supply fiber, and with the at least one supply fiber being a polarization-maintaining fiber.

In a further embodiment of the last-mentioned preferred embodiment, the optical fiber contains two phase delay elements and two supply fibers, with in each case one phase delay element being arranged between the sensor fiber and each of the two supply fibers. A sensor head such as this is suitable for measurements in a Sagnac configuration.

A current or magnetic field sensor according to the invention is characterized by having a sensor head according to the invention. The advantages of the sensor result from those of the sensor head.

Further preferred embodiments and advantages are evident from the dependent patent claims and from the figures.

BRIEF DESCRIPTION OF THE DRAWINGS

The subject matter of the invention will be explained in more detail in the following text with reference to preferred exemplary embodiments, which are illustrated in the attached drawings, in which, schematically.

Figure 1:
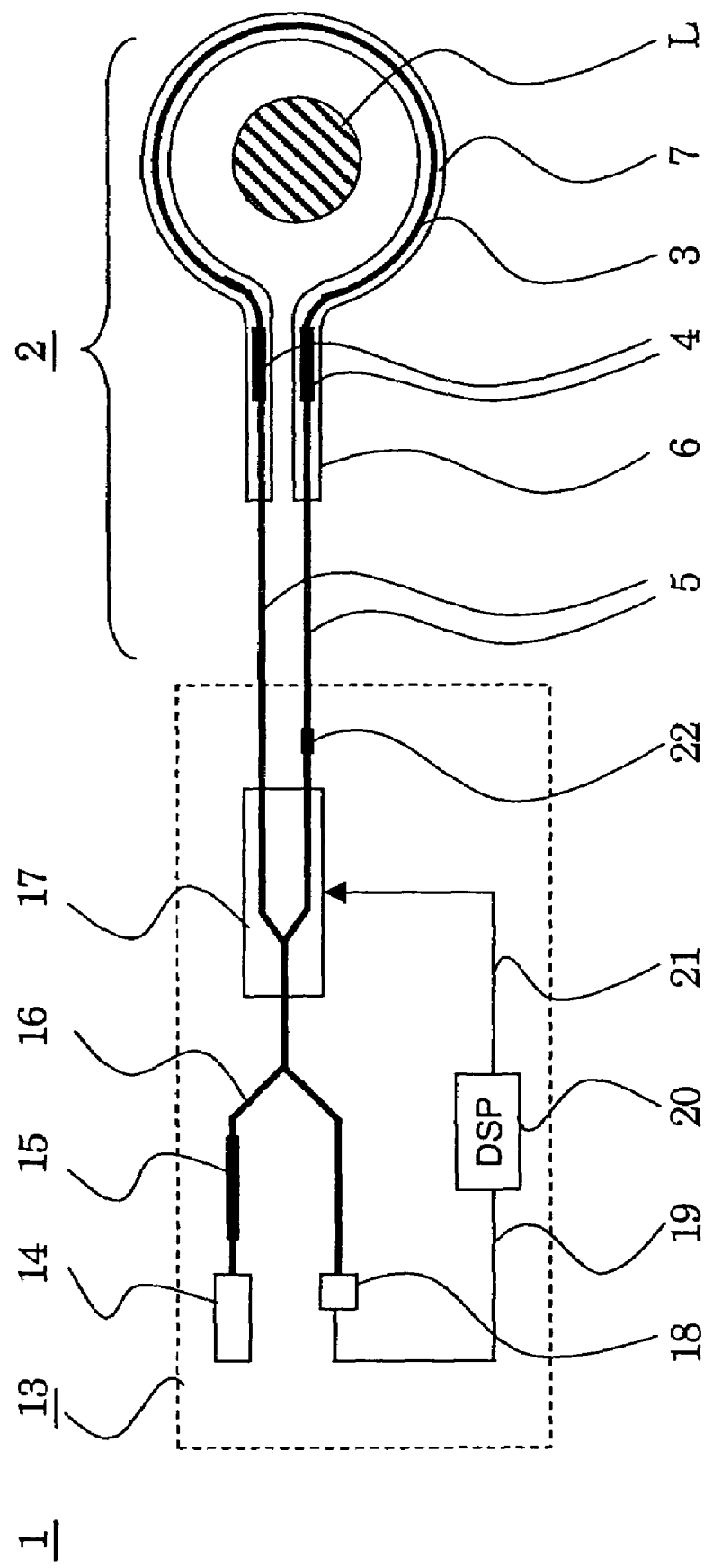
FIG. 1 shows a current sensor according to the invention in a Sagnac configuration.

Reference symbols used in the drawings and their meanings are listed in summarized form in the list of reference symbols. In principle, identical parts or parts having the same effect are provided with the same reference symbols in the figures. The described exemplary embodiments are examples of the subject matter of the invention and have no restrictive effect.

Approaches to Implementation of the Invention

FIG. 1 shows, schematically, a current sensor 1 according to the invention in a Sagnac configuration. The sensor 1 comprises an optoelectronic module 13 and a sensor head 2, which are optically connected to one another by means of two advantageously polarization-maintaining supply fibers 5. Except for a few details of the sensor head 2, the sensor 1 may advantageously be designed in the same way as that described in European Laid-Open Specification EP 1154278, whose entire disclosure content is hereby adopted in the description. Furthermore, the sensor is also advantageously temperature-compensated, as is described in the European Laid-Open Specification EP 1115000 or in the PCT application with the international file reference PCT/CH02/00473 (international date of filing Aug. 29, 2002), the entire disclosure content of which two documents is hereby included in the description.

The fundamental design and the basic function of the sensor are described once again here, despite the laid-open specifications included in the description.

The optoelectronic module 13 contains a light source 14, preferably a superluminescence diode or a laser diode which is operated below the laser threshold, and a depolarizer 15. The light which is produced by the light source 14 and is depolarized by the depolarizer 15 is passed via a fiber coupler 16 to a phase modulator 17. An integrated-optical lithium niobate phase modulator is preferably used as the phase modulator 17, and is operated in a closed loop (closed loop gyroscope). The phase shift that is caused by the current is in this case compensated for once again in the optoelectronic module 13. This has the advantage of good measurement accuracy, of wide dynamic range and very good linearity over the entire measurement range. The phase modulator 17 at the same time acts as a polarizer.

The phase modulator 17 is operatively connected via a control line 21 to a signal processor 20 and is controlled by the latter so as to achieve non-reciprocal phase modulation. The signal processor 20 is operatively connected via a signal line 19 to a detector 18, in order to evaluate detected light signals. The detector 18 is optically connected to the second arm of the fiber coupler 16. A fiber splice 22 or a plug connector 22 is preferably also provided within the opto-electronic module 13, in at least one of the two supply fibers 5. The supply fiber 5 can be disconnected there, and closed again, for installation of the sensor head 2. In the case of a plug connector 22, this is advantageously integrated in one housing wall of the optoelectronic module 13.

The sensor head 2 contains a sensor fiber 3, which is optically connected at each of its two ends by means of a phase delay element 4 to a respective supply fiber 5. The sensor fiber 2 is in the form of a coil in the installed state, as illustrated, with, as illustrated, one or else two or more turns arranged around an electrical conductor L which carries an electric current I that is to be measured. The number of turns formed by the sensor head 2 is advantageously an integer because this then results in a closed integration path, so that the measured value (current I) is independent of the position of the conductor L within the coil. In the case of a reflective sensor 1 (FIG. 2), the phase delay element 4 and the mirror 24 are then located alongside one another. In the case of a Sagnac sensor (FIG. 1), the two phase delay elements 4 are located alongside one another. The cladding and core of the sensor fiber are advantageously composed of quartz glass. This also applies to the phase delay elements 4 and to the supply fibers 5. The core cross section of the sensor fiber 3 is advantageously round. The core cross section of the phase delay elements 4 and of the supply fibers is advantageously elliptical.

The sensor fiber 3 and the phase delay elements 4 as well as a portion of the supply fibers 5, in each case, are arranged within a capillary 6. Furthermore, the capillary 6 contains a friction reducing means 7, for example a silicone oil.

During operation, two light waves with circular polarization or approximately circular polarization in the same rotation sense pass through the sensor fiber 3 in opposite directions. The light waves are subjected to a non-reciprocal optical phase shift $\Delta\phi_S$, which is proportional to the current I and, in the case of perfectly circular-polarized waves, is $\Delta\phi_S=2VNI$, where V is the Verdet constant of the sensor fiber 3 and N is the number of fiber turns in the coil. The case of non-circular (elliptically polarized) light waves is described in the cited European Laid-Open Specifications EP 1115000 and the cited PCT application with the international file reference PCT/CH02/00473 (international date of filing Aug. 29, 2002) and in K. Bohnert, P. Gabus, J. Nehring and H. Brändle, "Temperature and vibration insensitive fiber-optic current sensor", Journal of Lightwave Technology, Vol. 20 (2), p. 267-276, 2002. These documents also specify the corresponding value for $\Delta\phi_S$ for electrical polarization.

The circular (or elliptical) waves are produced by means of the fiber-optic phase delay elements 4 from linearly polarized waves propagating in the supply fibers 5. On leaving the sensor fiber 3, the phase delay elements 4 convert the circular (or elliptical) waves back to linear waves. The phase shift is preferably measured by means of a method and a corresponding optoelectronic apparatus, as are known for fiber-optic gyros. In this context, see also the publication R. A. Bergh, H. C. Lefevre, and H. J. Shaw, "An overview of fiber-optic gyroscopes". J. Lightw. Technol., Vol. 2(2), p. 91-107, 1984, whose entire disclosure content is hereby included in the description.

The further details of the sensor head 2 are illustrated in more detail in FIG. 3 and will be discussed in conjunction with FIG. 3.

Figure 2:
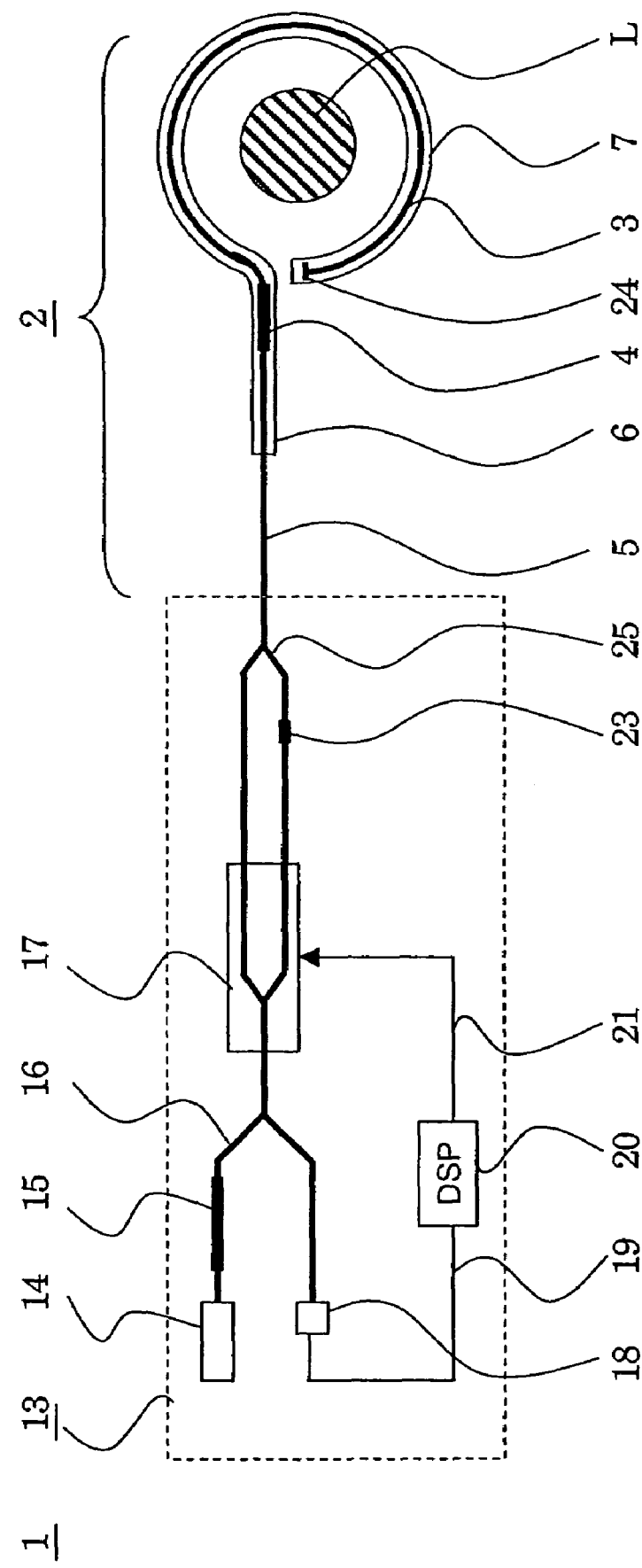
FIG. 2 shows a current sensor according to the invention in a reflection configuration.

Analogously to FIG. 1, FIG. 2 shows, schematically, a current sensor according to the invention in a reflection configuration. The statements made with regard to FIG. 1 apply to the optoelectronic module 13, except that there is no need to provide a 0° fiber splice 22 or plug connector 22 because the sensor head, in contrast to the Sagnac configuration, does not form a loop, and there is therefore no need to open a fiber for installation. The two outputs of the phase modulator 17 are joined together in a polarization-maintaining fiber coupler 25, with a 90° fiber splice 23 being provided in one of the two fiber branches. The 90° fiber splice 23 is not required if the fiber coupler 25 is connected to the phase modulator 17 in such a way that the fast fiber axis is aligned parallel to the polarization direction at one fiber end, and the slow axis is aligned parallel to the polarization direction at the other end. The output of the polarization-maintaining fiber coupler 25 is optically connected to the supply fiber 5. The supply fiber 5 is optically connected via a phase delay element 4 to one end of the sensor fiber 3. The other end of the sensor fiber 3 is mirrored, or has a mirror 24. The capillary 6 encloses a portion of the supply fiber 5, the phase delay element 4 and the sensor fiber 3, and contains a friction reducing means 7.

Two circular or approximately circular waves rotating in opposite senses and with the same propagation direction pass through the fiber coil, which is formed by the sensor head 2. The waves are reflected at the mirrored end 24 of the sensor fiber 3, and pass through the coil a second time in the opposite direction. The total optical phase shift produced by the current I is in this case $\Delta\phi_R=4VNI$, in the case of perfectly circular-polarized light waves. The two circular-polarized waves are produced by means of the phase delay element 4 from two waves that are linearly polarized at right angles to one another, and are converted back to waves that are linear polarized at right angles to one another on leaving the coil. The phase shift $\Delta\phi_R$ is preferably measured by means of an optoelectronic apparatus as is known from the cited European Laid-Open Specification EP 1154278 (modified gyro module). Otherwise, the statements relating to FIG. 1 still apply.

Figure 3:
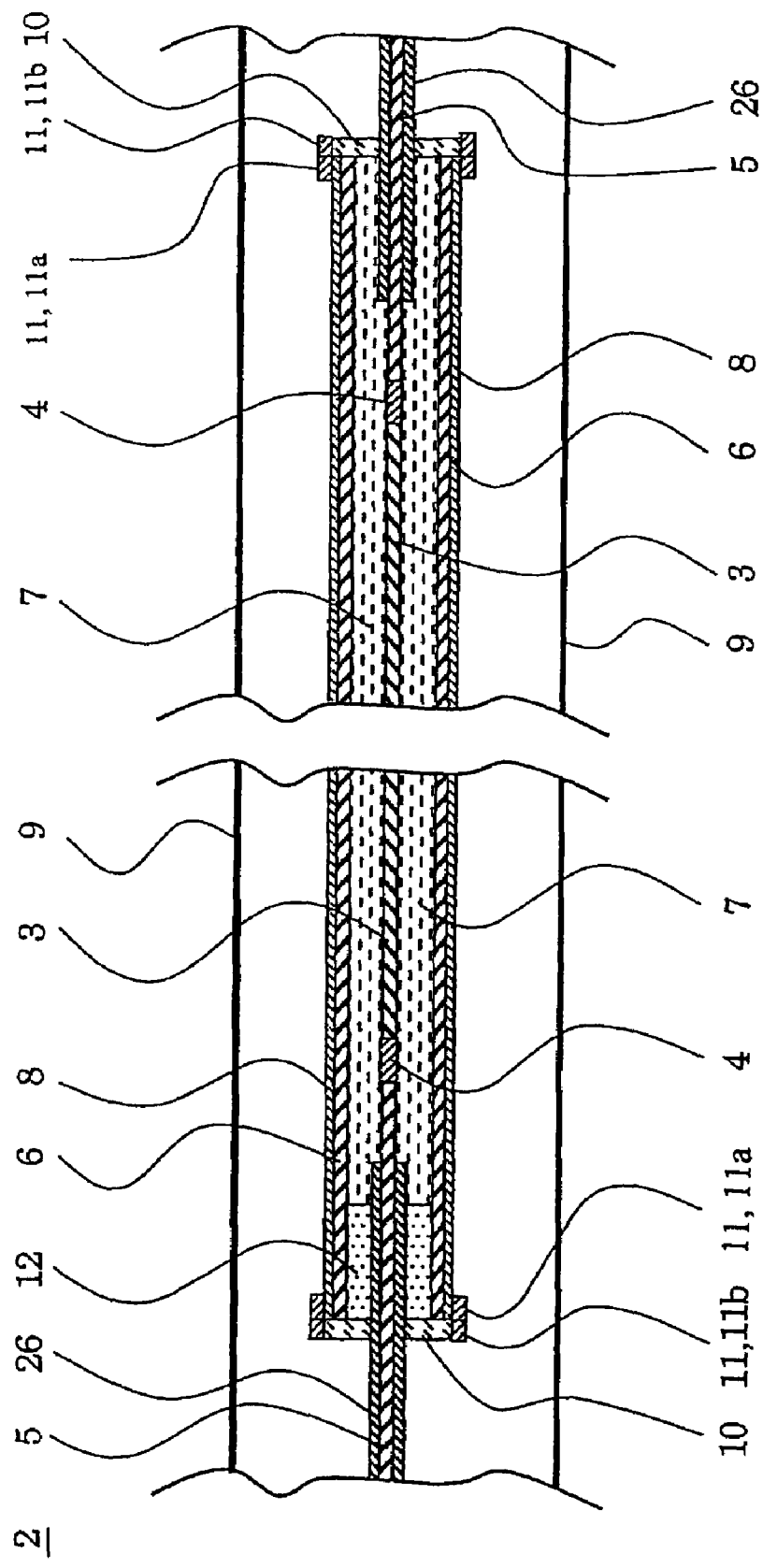
FIG. 3 shows a sensor head according to the invention in a Sagnac configuration.

FIG. 3 shows, schematically, a sensor head 2 according to the invention in a Sagnac configuration, as may be used, for example, in a sensor as shown in FIG. 1. As has already been illustrated in FIG. 1, the two supply fibers 5 are each optically connected via a phase delay element 4 to a respective end of the sensor fiber 3. Furthermore, a portion of each of the supply fibers 5 and the two phase delay elements 4 as well as the entire sensor fiber 3 are arranged within the capillary 6. For the sake of simplicity, the sensor head 2 is illustrated in the extended state, and not in the installed state, in which it forms a coil.

The supply fibers 5 advantageously have a fiber protective sheath 26 in places, which is advantageously removed at the end facing the respective phase delay element 4. The sensor fiber 3 and, advantageously, the phase delay elements 4 as well, are free of their fiber protective sheaths, so that the fiber cladding which surrounds the fiber core is not protected by a fiber protective sheath. The capillary 6 essentially carries out the function of the fiber protective sheath, of mechanically protecting the fiber (fiber cladding and fiber core), with the capillary 6 allowing considerably better mechanical protection than the fiber protective sheath. The capillary 6 is advantageously composed of quartz glass. This is because the capillary 6 then has the same thermal coefficient of expansion as a quartz glass fiber (in particular the sensor fiber 3), thus minimizing the influence of temperature changes. The sensor fiber 3 is located loosely in the capillary 6.

The friction reducing means 7, for example silicone oil, is introduced into the space between the fiber and the inner face of the capillary 6. In order to prevent the friction reducing means 7 from emerging from the capillary 6, the capillary 6 is closed at both of its ends by means of a closure means 10. The closure means 10 may be a prefabricated cover or, better, an adhesive 10, in particular an adhesive 10 which can be cured by means of ultraviolet light. The fiber advantageously has a fiber protective sheath 26 in the area of the closure means 10.

Since the adhesion between the adhesive 10 and an inner wall of the capillary 6 which is wetted with an oil is poor, an extension piece 11, which is in the form of a flexible tube, is in each case advantageously fitted externally to each of the capillary ends. A first portion 11a of the extension piece 11 which is in the form of a flexible tube surrounds the capillary end, and a second portion 11b of the extension piece 11 which is in the form of a flexible tube projects beyond the capillary end in the axial direction, typically by a few millimeters. The adhesive 10 is introduced into the second portion 11b of the extension piece 11, which is in the form of a flexible tube. Adhesive 10 may, of course, also be located within the capillary 6. A shrink sleeve can advantageously be used as the extension piece 11 which is in the form of a flexible tube. The adhesive 10 is advantageously cured once the shrink sleeve 11 has been shrunk by heat onto the capillary 6.

In order to absorb the thermal expansion of the silicone oil 7, a gas 12 is also arranged in the capillary 6. Dry air or nitrogen, for example, may simply be used as the gas 12. As is illustrated in FIG. 3, the air 12 may be in the form of an air column which is arranged at one end of the capillary 6. The length of the oil column is advantageous always chosen such that it still completely covers the sensor fiber 3, and advantageously the phase delay elements 4 as well, even at the lowest intended operating temperature of the sensor head 2. The length of the air column is advantageously chosen such that a maximum pressure, which can be predetermined, is not exceeded in the capillary 6.

A numerical example: the volume coefficient of expansion of silicone oil is in the order of magnitude of $10^{-3}/°$ C. If the silicone column has a length, for example, of 5 m, this changes by ±25 cm in the event of temperature changes of ±50° C. If the aim, by way of example, is to restrict the maximum pressure in the air column to 0.2 MPa (2 bar), the length of the air column at the initial temperature must be at least 50 cm, assuming that the pressure at the initial temperature is atmospheric pressure.

The capillary 6 advantageously has a capillary casing 8 for its external mechanical protection. This is advantageously formed from a polyimide. Damage to the external capillary surface (microscopic cracks), which could lead to a fracture of the capillary 6 in the event of frequent bending, are thus avoided.

In order to protect the capillary 6 and the fiber, the capillary 6 and at least a portion of the supply fibers 5 are arranged in a fiber protective hollow cable 9. The fiber protective hollow cable 9 is mechanically robust and protects the rest of the sensor head 2 and, if appropriate, the supply fibers 5 against mechanical influences and damage. The fiber protective hollow cable 9 advantageously encases the sensor head 2 and the supply fibers 5, from and as far as the optoelectronic module 13.

Figure 4:
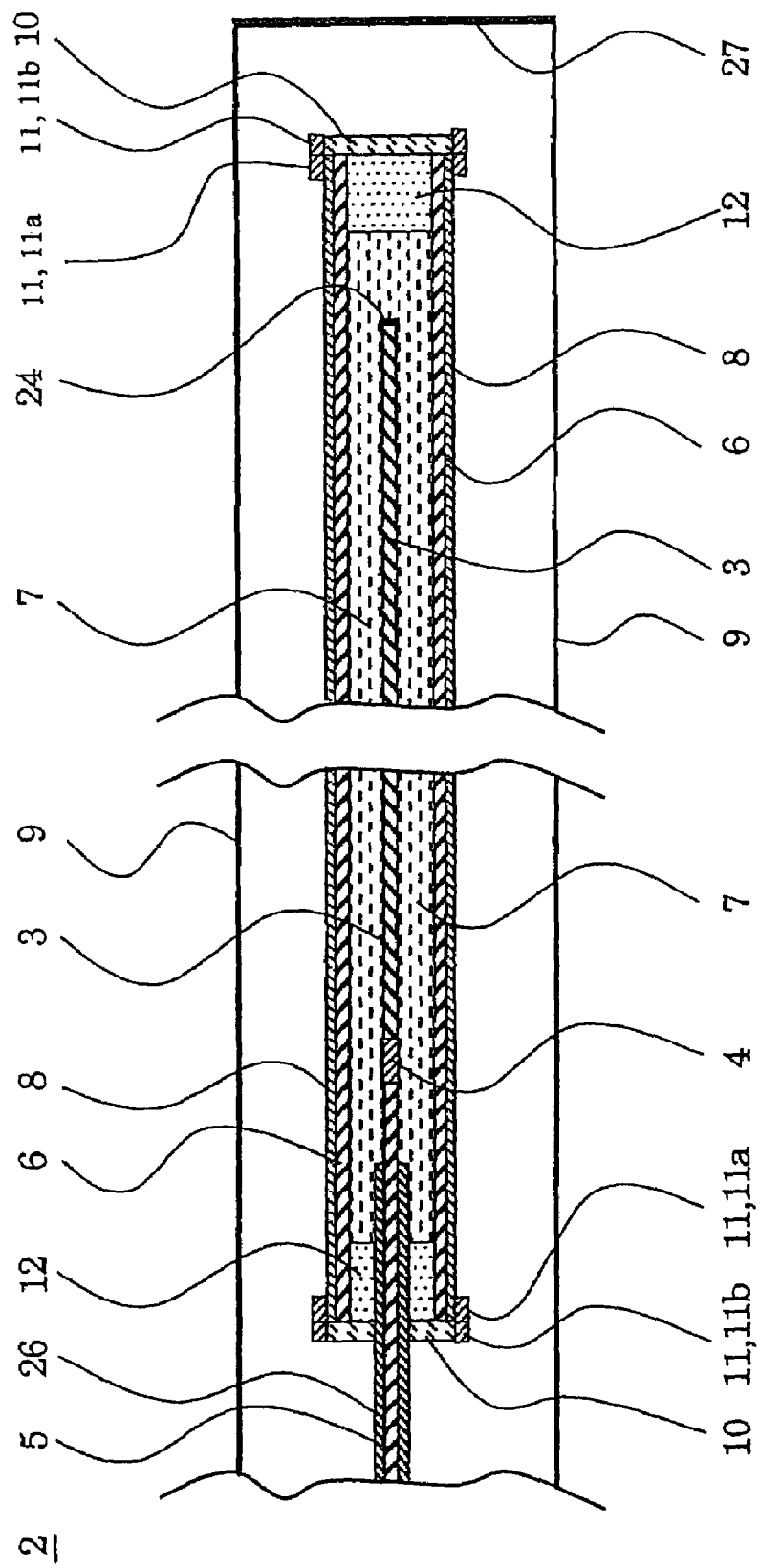
FIG. 4 shows a sensor head according to the invention in a reflection configuration.

Analogously to FIG. 3, FIG. 4 shows a sensor head 2 in a reflection configuration, as may be used, for example, in a sensor 1 as shown in FIG. 2. The left-hand part of FIG. 1 is identical to the left-hand part of FIG. 3. The right-hand part shows that the sensor fiber 3 is mirrored 24 at one end. The closure means 10 in the right-hand part of FIG. 4 has no opening for a supply fiber 5. Furthermore, the fiber protective hollow cable 9 has a fiber protective hollow cable termination 27 there.

FIG. 4 also shows that the gas 12 can be provided in the form of two volumes, which are advantageously each arranged at one end of the capillary 6. In principle, the gas may also be distributed differently in the capillary 6, for example in the form of a large number of smaller volumes, distributed over the length of the capillary 6. The use of an emulsion of the gas 12 and of a liquid friction reducing means 7 is also highly advantageous, on the one hand ensuring that the friction is reduced uniformly, and on the other hand being suitably compressible.

It is also possible to provide liquid and/or powdery friction reducing means 7 in the form of thin layers on the capillary inner face and/or on the fiber outside. If the friction reducing means 7 is an oil, for example, the oil can be allowed to flow through the capillary 6 when the fiber is being fitted to the capillary 6, so that suitable layers (oil films) remain behind. If the friction reducing means 7 is in the form of layers, the capillary 6 does not in general need to be closed.

If the friction reducing means 7 is oil, widely different types of oil may be used which have suitable viscosity in the intended operating temperature range. It is likewise possible to use greases as the friction reducing means 7. It is also possible to use different, preferably powdery, dry lubricants 7 (anti-adhesion means 7), for example molybdenum sulfide, graphite or tungsten disulfide. The particles of the dry lubricant 7 in this case act like tiny ball bearings. It is also feasible to use new types of nanotechnology lubricants comprising a single molecular layer, or a small number of molecular layers applied to the fiber. Examples: perfluoropolyether (PFPE), carbon nano tubes (CNT), hydroxyl-terminated perfluoropolyether (PFPE-OH). If dry lubricants 7 are used, the capillary 6 may in some cases remain unclosed, and in general there is also no need for an extension piece 11 in the form of a flexible tube, since many adhesives 10 adhere adequately to dry lubricants 7, so that the adhesive can be introduced directly into the capillary 6.

Figure 5:
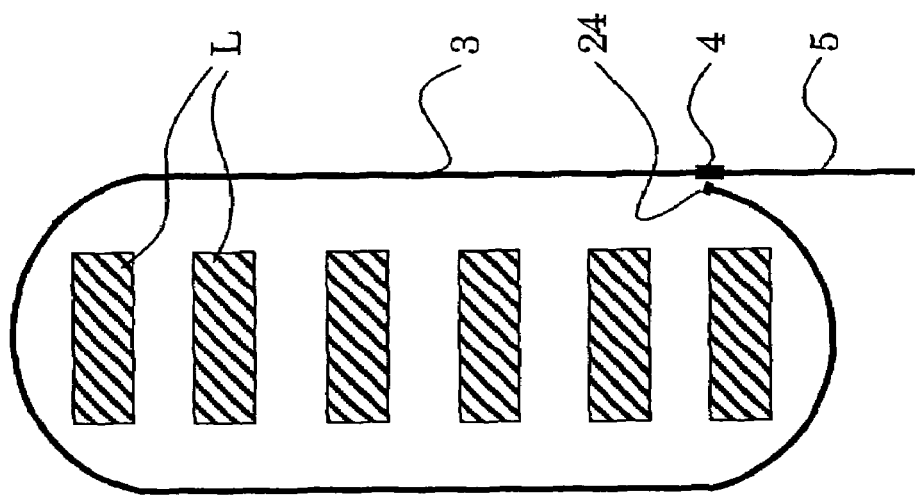
FIG. 5 shows a sensor head according to the invention in a coil shape in the form of a racetrack, with one turn, in a reflection configuration.

FIG. 5 shows, schematically, a sensor head 2 which forms a coil in the form of a racetrack with one turn. The sensor head is arranged around six busbars, which jointly carry the direct current I to be measured. The capability to arrange the sensor head 2 according to the invention in a flexible manner makes it possible to provide widely differing coil geometries, so that the sensor head 2 is very variable and can be adapted to very different measurement problems.

For installation of a sensor head 2 according to the invention, it is arranged such that it surrounds an electrical conductor L, whose current I is to be measured, or is arranged in the area of a magnetic field to be measured. The sensor head 2 may be flexibly deformed or bent for this purpose. The sensor fiber 2 is thus advantageously not heat-treated at at least its glass transition temperature. In order to avoid temperature-dependent effects caused by the fiber protective sheath, the fiber protective sheath is removed at least from the sensor fiber 2. Bending of the sensor head 2 and, in particular, of the sensor fiber 3 during transport and/or installation results in interaction forces between the fiber and the capillary wall. If the fiber adheres to the capillary 6 as a consequence of this, this produces birefringence in the fiber, which changes the polarization state of the light being carried in the fiber, to a disturbing extent. Such disturbances can also occur in the event of temperature changes.

A numerical example as to how the stretching and compression of the capillary walls resulting from bending of the capillary can result in mechanical forces being transmitted to the fiber: capillary internal diameter: 0.53 mm. The capillary 6 is bent from an extended state to a circular shape. The capillary wall located on the outside is then stretched through $\pi \times 0.53$ mm=1.66 mm per turn; the capillary wall facing the center point is compressed by the same amount. If the circle diameter (coil diameter) is, for example, 0.7 m, the relative expansion is thus 1.6 mm/($\pi \times 700$ mm)=$0.76 \times 10^{-3}$. With a fiber having a diameter of 80 micrometers (which is typical for current sensor applications), this corresponds to a tensile stress in the axial direction of 0.27 N. Since this force acts asymmetrically on the fiber (on the contact surface between the fiber and capillary), an asymmetric stress field and, associated with it, undesirable birefringence are formed in the fiber.

The capability to install the sensor head 2 is improved by the flexibility of the sensor head 2, since the coil need not be changed to the final form until the installation process, and the number of turns and the coil dimensions and geometry can be matched to the external characteristics and need not be fixed until after production of the sensor head but in particular because there is no need to disconnect an electrical conductor L for installation. Furthermore, the calibration of the sensor 1 (or of the sensor coil 2) cannot be changed by installation and transport. The achievable measurement accuracies are 0.1% to 0.2% over a temperature range from typically 0° C. to 60° C. or −40° C. to 85° C.

Figure 6:
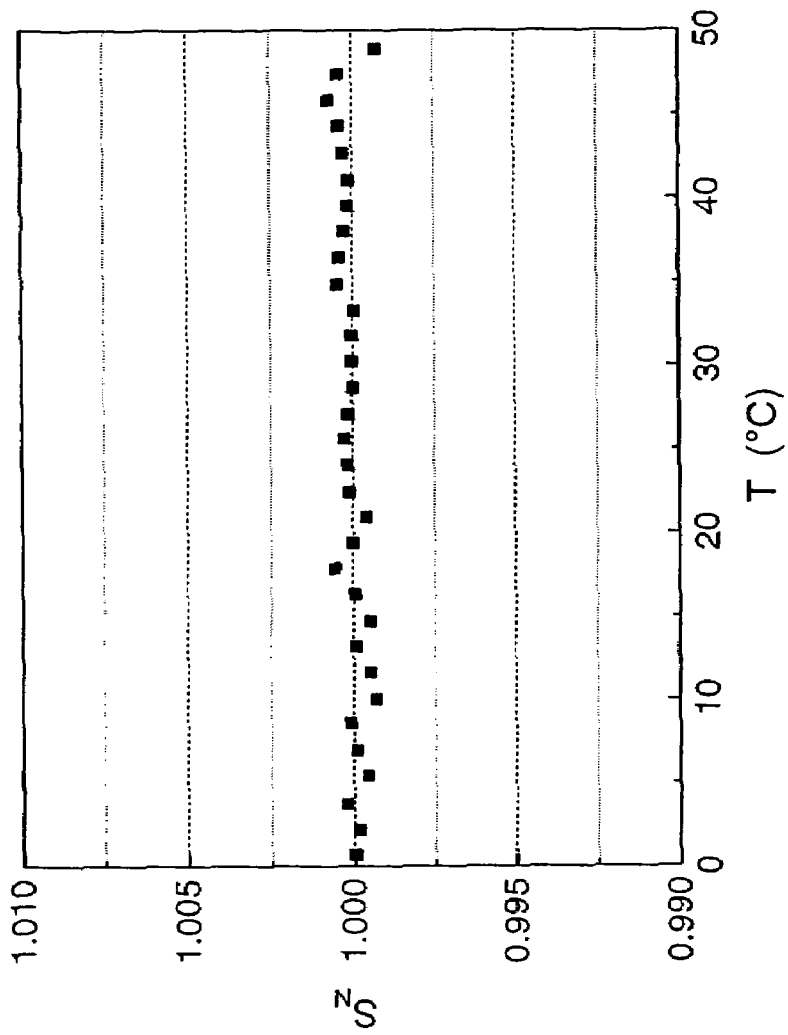
FIG. 6 shows a measured temperature dependency of a temperature-compensated current sensor according to the invention.

FIG. 6 shows a normalized signal $S_N$ for a current sensor 1 according to the invention with the reflective coil as shown in FIG. 4, as a function of the coil temperature T between 0° C. and 50° C. The sensor coil has two turns with a diameter of about 80 cm. The temperature dependency of the Faraday effect (that is to say the temperature dependency of the Verdet constant of the sensor fiber 2) is compensated for according to the invention, as is described in the cited EP 1115000. The normalized signal $S_N$ is independent of temperature within ±0.1%, which indicates that the disturbance effects which have been mentioned and are caused by the interaction between the fiber and the capillary inner face are effectively suppressed by means of the method according to the invention. This therefore allows very temperature-stable measurements.

The typical fiber diameters are about 80 micrometers, with typical capillary internal diameters being about 320 micrometers or 530 micrometers for capillary wall thicknesses of about 50 micrometers.

Two or more fibers, in particular two or more sensor fibers 3 may also be arranged in one capillary 6. The supply fibers 5 may also be arranged completely outside the capillary 6. It is also possible not to arrange the phase delay element or elements in the capillary.

In comparison to heat-treated sensor fibers 3, as described by way of example in the cited EP 0,856,737 A1, the sensor heads according to the invention have the advantage that they can be manufactured and handled without major effort, even in the case of large coils. The heat treatment of coils with a diameter of one meter or more would require impracticably large ovens, and the transportation of a coil that is as large as this is highly complex.

Further oils such as engine oils or hydraulic oils, or lubricating greases, may also be used as the friction reducing means 7.

The sensor head 2 according to the invention may, of course, be used not only with the sensors described above with polarization-maintaining supply fibers 5 and phase delay elements 4. Sagnac sensors with a 3×3 coupler may be mentioned here as an example of further possible sensor types which may advantageously have a sensor head 2 according to the invention, as described, by way of example, in J. H. Haywood et al., "Application on the NIMI Technique to the 3×3 Sagnac Fibre Current Sensor–Experimental Results", 15th Optical Fiber Sensors Conference, Portland, 6-10 May 2002, Portland, Oreg., USA, Technical Digest, pp 553-556 or in K. B. Rochford et al., "Polarization dependence of response functions in 3×3 Sagnac optical fiber current sensors", J. Lightwave Technology 12, 1504-1509, 1994. The publication by J. H. Haywood et al. mentions a "HiBi spun" fiber as the sensor fiber 3, although this may be replaced by a "LowBi" fiber with a round core cross section. The publication by K. B. Rochford et al. mentions a heat-treated sensor fiber 3, although this may also be replaced by a fiber which has not been heat-treated. In the case of Sagnac sensors with 3×3 couplers, fibers which do not maintain polarization (preferably with a round core cross section) may be used as supply fibers 5. In this case, the sensor head 2 does not need to have a phase delay element 4.

Polarimetric sensors, such as those described by way of example in A. Papp, H. Harms, "Magneto-optical current transformer. 1: Principles" Applied Optics, 19, 3729-3734, 1980 or in A. J. Rogers, et al., "Vibration immunity for optical fibre current measurement" in 10th Optical Fiber Sensors Conference, Glasgow, 11-13 Oct., 1994, B. Culshaw, J. Jones Editors, Proceedings SPIE 2360, pp 40-44, 1994, may also be mentioned as another example of possible sensor types which may advantageously have a sensor head 2 according to the invention. In the case of a polarimetric sensor, a polarizer is arranged at each of the two ends of the sensor fiber 3, with the polarizers being aligned at 45° with respect to one another with a disappearing magnetic field. One polarizer is typically in each case arranged between the sensor fiber 3 and each of the two supply fibers 5, 5'. The supply fibers advantageously have a round core cross section. In the case of the sensor which is described in the publication by A. Papp and H. Harms, the sensor fiber 3 is at the same time also a supply fiber.

LIST OF REFERENCE SYMBOLS

1 Sensor
2 Sensor head
3 Sensor fiber
4 Phase delay element
5 Supply fiber
6 Capillary
7 Friction reducing means, oil
8 Capillary casing
9 Fiber protective hollow cable
10 Closure means, adhesive
11 Extension piece in the form of a flexible tube
11a First part of the extension piece in the form of a flexible tube
11b Second part of the extension piece in the form of a flexible tube
12 Gas, air
13 Optoelectronic module
14 Light source, laser, superluminescence diode depolarizer
16 Fiber coupler
17 Phase modulator
18 Detector, photodiode
19 Signal line
20 Signal processor
21 Control line
22 0° fiber splice or plug connector
23 90° splice
24 Mirror, mirrored end
25 Polarization-maintaining fiber coupler
26 Fiber protective sheath on the supply cable
27 Fiber protective hollow cable termination
I Electric current
L Electrical conductor, busbar
N Number of turns on the sensor coil
$S_N$ Normalized signal
T Temperature

The invention claimed is:

1. A fiber-optic sensor head for a current or magnetic field sensor, comprising
an optical fiber which contains a magnetooptically active sensor fiber and at least one supply fiber which are optically connected, with the sensor fiber having its fiber protective sheath removed, and
a capillary in which at least the sensor fiber is arranged, wherein the sensor head can be bent in the area of the sensor fiber, wherein a friction reducing means is provided in the capillary, in order to reduce the friction forces between the sensor fiber and the capillary, and wherein the sensor fiber is a fiber which has not been heat-treated at at least the softening temperature of the sensor fiber material, wherein further the friction reducing means is in the form of a thin friction-reducing layer on the fiber and/or on the inner face of the capillary, and the layers are composed of a dry lubricant or a nanotechnology lubricant comprising a single molecular layer or a small number of molecular layers.

2. The sensor head as claimed in claim 1, wherein, in the installed state, the sensor fiber has a radius of curvature of at least 0.25 m.

3. The sensor head as claimed in claim 1, wherein a portion of the at least one supply fiber is arranged within the capillary.

4. The sensor head as claimed in claim 1, the capillary and the sensor fiber comprising quartz glass.

5. The sensor head as claimed in claim 1, wherein the capillary is encased by a capillary casing.

6. The sensor head as claimed in claim 1, wherein the capillary is arranged within a fiber protective hollow cable.

7. A fiber-optic sensor head for a current or magnetic field sensor, comprising
an optical fiber which contains a magnetooptically active sensor fiber and at least one supply fiber which are optically connected, with the sensor fiber having its fiber protective sheath removed, and
a capillary in which at least the sensor fiber is arranged, wherein the sensor head can be bent in the area of the sensor fiber, wherein a friction reducing means is provided in the capillary, in order to reduce the friction forces between the sensor fiber and the capillary, and wherein the capillary is closed at its ends by means of a closure means, and contains a liquid as the friction reducing means, and the capillary contains a gas in order to absorb temperature-dependent volume changes of the friction reducing means.

8. The sensor head as claimed in claim 1, wherein, at its ends, the capillary is closed by means of an adhesive as a closure means.

9. The sensor head as claimed in claim 7, wherein, at each of its ends, the capillary is provided with an extension piece in the form of a flexible tube, with the extension pieces each having a first part which, at one end of the capillary, in each case externally surrounds the capillary or, possibly, the capillary casing, and each have a second part, which projects beyond the respective end of the capillary in the axial direction, with the closure means being introduced into the second part of the extension pieces.

10. The sensor head as claimed in claim 1, wherein the optical fiber contains at least one phase delay element, which is optically connected to the sensor fiber and to the at least one polarization-maintaining supply fiber, with the at least one phase delay element being arranged between the sensor fiber and the at least one supply fiber, and with the at least one supply fiber being a polarization-maintaining fiber.

11. The sensor head as claimed in claim 10, wherein the optical fiber contains two phase delay elements and two supply fibers, with in each case one phase delay element being arranged between the sensor fiber and each of the two supply fibers.

12. The sensor head as claimed in claim 7, wherein the gas is in the form of a single column arranged at one end of the capillary, or as two columns each arranged at one end of the capillary, or in the form of a greater number of separate volumes, which are distributed along the axis of the capillary, or is an emulsion formed from the friction reducing means and the gas.

13. The sensor head as claimed in claim 1, wherein the thin layers are formed from powdery dry lubricants selected from the group of molybdenum sulfide, graphite and tungsten disulfide, or from nanotechnolgy lubricants selected from the group of perfluoropolyether (PFPE), carbon nano tubes (CNT) and hydroxyl-terminated perfluoropolyether (PFPE-OH).

14. A fiber-optic sensor head for a current or magnetic field sensor, comprising
an optical fiber which contains a magnetooptically active sensor fiber and at least one supply fiber which are optically connected, with the sensor fiber having its fiber protective sheath removed, and
a capillary in which at least the sensor fiber is arranged, wherein the sensor head can be bent in the area of the sensor fiber, wherein a friction reducing means is provided in the capillary, in order to reduce the friction forces between the sensor fiber and the capillary, and wherein the sensor fiber is a fiber which has not been heat-treated at at least the softening temperature of the sensor fiber material, and
wherein further the friction reducing means is in the form of a thin friction-reducing layer on the fiber and/or on the inner face of the capillary, and the capillary is unclosed.

15. The sensor head as claimed in claim 14, wherein the thin layers are formed from a liquid and/or powdery friction reducing means.

16. The sensor head as claimed in claim 14, wherein the thin layers are formed from oil films, greases, dry lubricants or anti-adhesion means, or nanotechnolgy lubricants comprising a single molecular layer or a small number of molecular layers.

17. The sensor head as claimed in claim 14, wherein the thin layers are formed from powdery dry lubricants selected from the group of molybdenum sulfide, graphite and tungsten disulfide, or from nanotechnolgy lubricants selected from the group of perfluoropolyether (PFPE), carbon nano tubes (CNT) and hydroxyl-terminated perfluoropolyether (PFPE-OH).

18. The sensor head as claimed in claim 14, wherein, in the installed state, the sensor fiber has a radius of curvature of at least 0.25 m.

19. The sensor head as claimed in claim 14, wherein a portion of the at least one supply fiber is arranged within the capillary.

20. The sensor head as claimed in claim 14, the capillary and the sensor fiber comprising quartz glass.

21. The sensor head as claimed in claim 14, wherein the capillary is encased by a capillary casing.

22. The sensor head as claimed in claim 14, wherein the capillary is arranged within a fiber protective hollow cable.

* * * * *